(12) United States Patent
Huang

(10) Patent No.: US 10,519,343 B2
(45) Date of Patent: Dec. 31, 2019

(54) PRE-APPLIED UNDERFILL FILM CONTAINING NANO-PARTICULATE FILLER FOR 3DIC APPLICATIONS, COMPOSITIONS USEFUL FOR THE PREPARATION THEREOF, AND USES THEREOF

(71) Applicant: Henkel IP & Holding GmbH, Duesseldorf (DE)

(72) Inventor: Qiaohong Huang, Trabuco Canyon, CA (US)

(73) Assignee: HENKEL IP & HOLDING GMBH, Duesseldorf (DE)

( * ) Notice: Subject to any disclaimer, the term of this patent is extended or adjusted under 35 U.S.C. 154(b) by 0 days.

(21) Appl. No.: 15/198,549

(22) Filed: Jun. 30, 2016

(65) Prior Publication Data

US 2016/0312070 A1 Oct. 27, 2016

Related U.S. Application Data

(63) Continuation of application No. PCT/US2014/071785, filed on Dec. 22, 2014.

(60) Provisional application No. 61/922,922, filed on Jan. 2, 2014.

(51) Int. Cl.
| | | |
|---|---|---|
| C09J 4/06 | (2006.01) | |
| C09J 9/00 | (2006.01) | |
| C09J 11/04 | (2006.01) | |
| H01L 23/29 | (2006.01) | |
| H01L 23/31 | (2006.01) | |

(52) U.S. Cl.
CPC . *C09J 4/06* (2013.01); *C09J 9/00* (2013.01); *C09J 11/04* (2013.01); *H01L 23/295* (2013.01); *H01L 23/3142* (2013.01)

(58) Field of Classification Search
CPC ....... C08K 3/36; C09J 4/06; C09J 9/00; C09J 11/04; B82Y 30/00; H01L 23/293; H01L 23/295; H01L 23/3142
USPC ....................................................... 523/447
See application file for complete search history.

(56) References Cited

U.S. PATENT DOCUMENTS

| | | | |
|---|---|---|---|
| 5,717,034 A | 2/1998 | Dershem et al. | |
| 7,790,797 B2 | 9/2010 | Blumenschein et al. | |
| 2006/0069232 A1* | 3/2006 | Dershem | C08L 67/07 528/272 |
| 2009/0018239 A1* | 1/2009 | Woods | C08G 59/1455 523/459 |
| 2010/0084091 A1* | 4/2010 | Levandoski | C08F 290/067 156/331.4 |
| 2011/0070436 A1* | 3/2011 | Nguyen | C09J 7/20 428/355 EP |
| 2011/0139496 A1* | 6/2011 | Nakamura | B32B 7/12 174/256 |
| 2015/0348858 A1* | 12/2015 | Koyama | C09J 133/04 438/126 |

FOREIGN PATENT DOCUMENTS

| | | |
|---|---|---|
| CN | 102604280 A | 7/2012 |
| CN | 103140558 A | 6/2013 |
| JP | 3189988 | 7/2001 |
| JP | 2006339057 | 12/2006 |
| JP | 2010-37534 A | 2/2010 |
| JP | 2012-53497 A | 3/2012 |
| RU | 2277563 | 6/2006 |
| WO | 2013012587 A2 | 1/2013 |

OTHER PUBLICATIONS

International Search Report issued in connection with International Patent Application No. PCT/US2014/071785 dated May 21, 2015.

* cited by examiner

*Primary Examiner* — David T Karst
(74) *Attorney, Agent, or Firm* — Steven C. Bauman

(57) ABSTRACT

Provided herein are compositions having a good balance between the curing speed, transparency, tackiness and/or melt viscosity thereof. In one aspect, there are provided compositions containing nano-particulate filler and the use thereof in the preparation of a variety of electronic components, e.g., three-dimensional integrated circuits. In certain aspects, there are provided three-dimensional integrated circuits prepared employing invention compositions (i.e., compositions containing nano-particulate filler), as well as methods for preparing such compositions, and the resulting three-dimensional integrated circuits. In certain aspects, there are also provided methods for improving the curing speed, transparency, tackiness and/or melt viscosity of pre-applied underfill compositions. In certain aspects, there are also provided pre-applied underfill compositions with improved processability.

16 Claims, No Drawings

PRE-APPLIED UNDERFILL FILM CONTAINING NANO-PARTICULATE FILLER FOR 3DIC APPLICATIONS, COMPOSITIONS USEFUL FOR THE PREPARATION THEREOF, AND USES THEREOF

FIELD

The present invention relates to pre-applied underfill compositions. In one aspect, the invention relates to underfill films. In another aspect, the invention relates to compositions containing nano-particulate filler and the use thereof in the preparation of three-dimensional integrated circuits. In yet another aspect, the invention relates to three-dimensional integrated circuits and methods for preparing same. In still another aspect, the invention relates to methods for improving the curing speed, transparency, tackiness and/or melt viscosity of silica-containing underfill formulations.

SUMMARY

In accordance with the present invention, there are provided compositions having a good balance between the curing speed, transparency, tackiness and/or melt viscosity thereof. In one aspect, there are provided compositions containing nano-particulate filler and the use thereof in the preparation of a variety of electronic components, e.g., three-dimensional integrated circuits. In certain aspects, there are provided three-dimensional integrated circuits prepared employing invention compositions (i.e., compositions containing nano-particulate filler), as well as methods for preparing such compositions, and the resulting three-dimensional integrated circuits.

In certain aspects, there are also provided methods for improving the curing speed, transparency, tackiness and/or melt viscosity of pre-applied underfill compositions. In certain aspects, there are also provided pre-applied underfill compositions with improved processability.

DETAILED DESCRIPTION

In accordance with the present invention, there are provided compositions comprising:
at least one radical polymerizable monomer having one or more functional groups selected from the group consisting of a vinyl group, a maleimide group, a nadimide group, an itaconimide group, a (meth)acryloyl group and an allyl group;
a polymer having one or more polar groups selected from the group consisting of an hydroxyl group, a carboxyl group, and a (meth)acryloyl group;
optionally, an epoxy monomer;
optionally, an epoxy cure agent;
a free-radical polymerization initiator;
a particulate filler, wherein at least 5 wt % of said filler has a particle size in the range of about 2-150 nanometers, and the remaining filler has a particle size no greater than 5 microns;
optionally a radical stabilizer; and
optionally a non-reactive organic diluent therefore,
wherein the melt viscosity of said composition is less than 20,000 poise, when measured at a ramp rate of 5-10° C./minute.

In certain embodiments, the melt viscosity of invention compositions, and particle size of the particulate filler employed therein, is suitable to allow use thereof as underfill material, wherein said compositions are capable of flowing into small gaps (e.g., gaps as small as 10-20 microns).

In certain embodiments, the cure speed of invention compositions, as measured by gel time, falls in the range of about 1-5 seconds at 250° C.

In certain embodiments, the tackiness of invention compositions, as measured by a texture analyzer, is less than 100 gram force at room temperature.

In certain embodiments, underfill films prepared from invention compositions has at least 80% transparency to wavelengths of 550 nm or longer.

Compositions according to the present invention may optionally further comprise one or more flow additives, adhesion promoters, rheology modifiers, toughening agents, fluxing agents, and the like, as well as mixtures of any two or more thereof.

As used herein, the term "flow additives" refers to compounds which modify the viscosity of the formulation to which they are introduced. Exemplary compounds which impart such properties include silicon polymers, ethyl acrylate/2-ethylhexyl acrylate copolymers, alkylol ammonium salts of phosphoric acid esters of ketoxime, and the like, as well as combinations of any two or more thereof.

As used herein, the term "adhesion promoters" refers to compounds which enhance the adhesive properties of the formulation to which they are introduced.

As used herein, the term "rheology modifiers" refers to additives which modify one or more physical properties of the formulation to which they are introduced.

As used herein, the term "toughening agents" refers to additives which enhance the impact resistance of the formulation to which they are introduced.

As used herein, the term "fluxing agents" refers to reducing agents which prevent oxides from forming on the surface of the molten metal.

Exemplary radical polymerizable monomers contemplated for use herein include compounds having vinyl functional groups thereon, i.e., compounds of the structure R—CH=CH$_2$, wherein R is an organic radical having 1-30 carbons.

Exemplary maleimides, nadimides, or itaconimides contemplated for use herein include compounds having the structure:

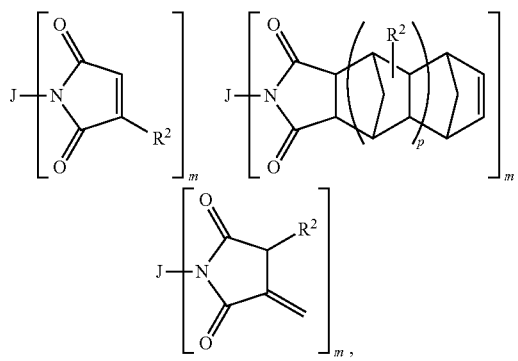

respectively, wherein:
m is 1-15,
p is 0-15,
each R$^2$ is independently selected from hydrogen or lower alkyl, and J is a monovalent or a polyvalent radical selected from:
hydrocarbyl or substituted hydrocarbyl species typically having in the range of about 6 up to about 500 carbon atoms, where the hydrocarbyl species is selected from alkyl, alkenyl, alkynyl, cycloalkyl, cycloalkenyl, aryl, alkylaryl, arylalkyl, aryalkenyl, alkenylaryl, arylalkynyl or alkynylaryl;
hydrocarbylene or substituted hydrocarbylene species typically having in the range of about 6 up to about 500 carbon atoms, where the hydrocarbylene species are selected from alkylene, alkenylene, alkynylene, cycloalkylene, cycloalkenylene, arylene, alkylarylene, arylalkylene, arylalkenylene, alkenylarylene, arylalkynylene or alkynylarylene,
aromatic hydrocarbyl or substituted aromatic hydrocarbyl species having in the range of about 6 up to about 300 carbon atoms, where the aromatic hydrocarbyl species is selected from aryl, alkylaryl, arylalkyl, aryalkenyl, alkenylaryl, arylalkynyl or alkynylaryl;
aromatic hydrocarbylene or substituted aromatic hydrocarbylene species having in the range of about 6 up to about 300 carbon atoms, where the aromatic hydrocarbylene species are selected from arylene, alkylarylene, arylalkylene, arylalkenylene, alkenylarylene, arylalkynylene or alkynylarylene,
heterocyclic or substituted heterocyclic species having in the range of about 6 up to about 300 carbon atoms,
polysiloxane, or
polysiloxane-polyurethane block copolymers, as well as combinations of one or more of the above with a linker selected from a covalent bond, —O—, —S—, —NR—, —NR—C(O)—, —NR—C(O)—O—, —NR—C(O)—NR—, —S—C(O)—, —S—C(O)—O—, —S—C(O)—NR—, —O—S(O)$_2$—, —O—S(O)$_2$—O—, —O—S(O)$_2$—NR—, —O—S(O)—, —O—S(O)—O—, —O—S(O)—NR—, —O—NR—C(O)—, —O—NR—C(O)—O—, —O—NR—C(O)—NR—, —NR—O—C(O)—, —NR—O—C(O)—O—, —NR—O—C(O)—NR—, —O—NR—C(S)—, —O—NR—C(S)—O—, —O—NR—C(S)—NR—, —NR—O—C(S)—, —NR—O—C(S)—O—, —NR—O—C(S)—NR—, —O—C(S)—, —O—C(S)—O—, —O—C(S)—NR—, —NR—C(S)—, —NR—C(S)—O—, —NR—C(S)—NR—, —S—S(O)$_2$—, —S—S(O)$_2$—O—, —S—S(O)$_2$—NR—, —NR—O—S(O)—, —NR—O—S(O)—O—, —NR—O—S(O)—NR—, —NR—O—S(O)$_2$—, —NR—O—S(O)$_2$—O—, —NR—O—S(O)$_2$—NR—, —O—NR—S(O)—, —O—NR—S(O)—O—, —O—NR—S(O)—NR—, —O—NR—S(O)$_2$—O—, —O—NR—S(O)$_2$—NR—, —O—NR—S(O)$_2$—, —O—P(O)R$_2$—, —S—P(O)R$_2$—, or —NR—P(O)R$_2$—; where each R is independently hydrogen, alkyl or substituted alkyl.

Compositions according to the present invention include compounds wherein J is oxyalkyl, thioalkyl, aminoalkyl, carboxyalkyl, oxyalkenyl, thioalkenyl, aminoalkenyl, carboxyalkenyl, oxyalkynyl, thioalkynyl, aminoalkynyl, carboxyalkynyl, oxycycloalkyl, thiocycloalkyl, aminocycloalkyl, carboxycycloalkyl, oxycloalkenyl, thiocycloalkenyl, aminocycloalkenyl, carboxycycloalkenyl, heterocyclic, oxyheterocyclic, thioheterocyclic, aminoheterocyclic, carboxyheterocyclic, oxyaryl, thioaryl, aminoaryl, carboxyaryl, heteroaryl, oxyheteroaryl, thioheteroaryl, aminoheteroaryl, carboxyheteroaryl, oxyalkylaryl, thioalkylaryl, aminoalkylaryl, carboxyalkylaryl, oxyarylalkyl, thioarylalkyl, aminoarylalkyl, carboxyarylalkyl, oxyarylalkenyl, thioarylalkenyl, aminoarylalkenyl, carboxyarylalkenyl, oxyalkenylaryl, thioalkenylaryl, aminoalkenylaryl, carboxyalkenylaryl, oxyarylalkynyl, thioarylalkynyl, aminoarylalkynyl, carboxyarylalkynyl, oxyalkynylaryl, thioalkynylaryl, aminoalkynylaryl or carboxyalkynylaryl, oxyarylene, thioarylene, aminoarylene, carboxyarylene, oxyalkylarylene, thioalkylarylene, aminoalkylarylene, carboxyalkylarylene, oxyarylalkylene, thioarylalkylene, aminoarylalkylene, carboxyarylalkylene, oxyarylalkenylene, thioarylalkenylene, aminoarylalkenylene, carboxyarylalkenylene, oxyalkenylarylene, thioalkenylarylene, aminoalkenylarylene, carboxyalkenylarylene, oxyarylalkynylene, thioarylalkynylene, aminoarylalkynylene, carboxy arylalkynylene, oxyalkynylarylene, thioalkynylarylene, aminoalkynylarylene, carboxyalkynylarylene, heteroarylene, oxyheteroarylene, thioheteroarylene, aminoheteroarylene, carboxyheteroarylene, heteroatom-containing di- or polyvalent cyclic moiety, oxyheteroatom-containing di- or polyvalent cyclic moiety, thioheteroatom-containing di- or polyvalent cyclic moiety, aminoheteroatom-containing di- or polyvalent cyclic moiety, or a carboxyheteroatom-containing di- or polyvalent cyclic moiety.

Exemplary acrylates contemplated for use herein include monofunctional (meth)acrylates, difunctional (meth)acrylates, trifunctional (meth)acrylates, polyfunctional (meth)acrylates, and the like.

Exemplary monofunctional (meth)acrylates include phenylphenol acrylate, methoxypolyethylene acrylate, acryloyloxyethyl succinate, fatty acid acrylate, methacryloyloxyethylphthalic acid, phenoxyethylene glycol methacrylate, fatty acid methacrylate, β-carboxyethyl acrylate, isobornyl acrylate, isobutyl acrylate, t-butyl acrylate, hydroxyethyl acrylate, hydroxypropyl acrylate, dihydrocyclopentadiethyl acrylate, cyclohexyl methacrylate, t-butyl methacrylate, dimethylaminoethyl methacrylate, diethylaminoethyl methacrylate, t-butylaminoethyl methacrylate, 4-hydroxybutyl acrylate, tetrahydrofurfuryl acrylate, benzyl acrylate, ethylcarbitol acrylate, phenoxyethyl acrylate, methoxytriethylene glycol acrylate, monopentaerythritol acrylate, dipentaerythritol acrylate, tripentaerythritol acrylate, polypentaerythritol acrylate and the like.

Exemplary difunctional (meth)acrylates include hexanediol dimethacrylate, hydroxyacryloyloxypropyl methacrylate, hexanediol diacrylate, urethane acrylate, epoxyacrylate, bisphenol A-type epoxyacrylate, modified epoxyacrylate, fatty acid-modified epoxyacrylate, amine-modified bisphenol A-type epoxyacrylate, allyl methacrylate, ethylene glycol dimethacrylate, diethylene glycol dimethacrylate, ethoxylated bisphenol A dimethacrylate, tricyclodecanedimethanol dimethacrylate, glycerin dimethacrylate, polypropylene glycol diacrylate, propoxylated ethoxylated bisphenol A diacrylate, 9,9-bis(4-(2-acryloyloxyethoxy)phenyl)fluorene, tricyclodecane diacrylate, dipropylene glycol diacrylate, polypropylene glycol diacrylate, PO-modified neopentyl glycol diacrylate, tricyclodecanedimethanol diacrylate, 1,12-dodecanediol dimethacrylate, and the like.

Exemplary trifunctional (meth)acrylates include trimethylolpropane trimethacrylate, trimethylolpropane triacrylate, trimethylolpropane ethoxy triacrylate, polyether triacrylate, glycerin propoxy triacrylate, and the like.

Exemplary polyfunctional (meth)acrylates include dipentaerythritol polyacrylate, dipentaerythritol hexaacrylate, pentaerythritol tetraacrylate, pentaerythritolethoxy tetraacrylate, ditrimethylolpropane tetraacrylate, and the like.

Additional exemplary acrylates contemplated for use in the practice of the present invention include those described in U.S. Pat. No. 5,717,034, the entire contents of which are hereby incorporated by reference herein.

Exemplary radical polymerizable monomers contemplated for use herein include compounds having allyl functional groups thereon, i.e., compounds of the structure R—CH$_2$—CH=CH$_2$, wherein R is an organic radical having 1-30 carbons.

In some embodiments of the present invention, radical polymerizable monomers contemplated for use herein comprise both an acrylate (e.g., a (meth)acryloyl group) and an allyl group.

In some embodiments, radical polymerizable monomers contemplated for use herein comprise a maleimide, nadimide or itaconimide functional group and an acrylate functional group.

In one aspect, invention compositions comprise in the range of about 5-40 wt % of said radical polymerizable monomer. In certain embodiments, invention compositions comprise in the range of about 10-25 wt % of said radical polymerizable monomer.

Polymers having a polar group contemplated for use herein include phenoxy resins, polyester resins, polyurethane resins, polyimide resins, siloxane-modified polyimide resins, polybutadiene, polypropylene, styrene-butadiene-styrene copolymer, styrene-ethylene-butylene-styrene copolymer, polyacetal resins, polyvinylbutyral resin, polyvinylacetal resin, polyamide resins, acrylonitrile-butadiene copolymer, acrylonitrile-butadiene-acrylic acid copolymer, acrylonitrile-butadiene-styrene copolymer, polyvinyl acetate, nylon, (meth)acrylic resins, (meth)acrylic rubbers, urethane (meth)acrylate polymers, acrylic copolymers and modified polymers thereof.

Compositions according to the invention typically comprise in the range of about 5-40 wt % of said polymer having a polar group. In some embodiments, compounds according to the present invention comprise in the range of about 5-20 wt % of said polymer having a polar group.

In certain embodiments, invention compositions comprise in the range of about 5-30 wt % of said polymer having one or more polar groups. In certain embodiments, invention compositions comprise in the range of 5-10 wt % of said polymer having one or more polar groups.

Exemplary epoxy monomers contemplated for use in the practice of the present invention include liquid-type epoxies based on bisphenol A, solid-type epoxies based on bisphenol A, liquid-type epoxies based on bisphenol F (e.g., Epiclon EXA-835LV), multifunctional epoxies based on phenol-novolac resin, dicyclopentadiene-type epoxies (e.g., Epiclon HP-7200L), naphthalene-type epoxies, and the like, as well as mixtures of any two or more thereof.

Additional exemplary epoxy monomers contemplated for use herein include diepoxides of the cycloaliphatic alcohol, hydrogenated bisphenol A (commercially available as Epalloy 5000), difunctional cycloaliphatic glycidyl esters of hexahydrophthallic anhydride (commercially available as Epalloy 5200), Epiclon EXA-835LV, Epiclon HP-7200L, and the like, as well as mixtures of any two or more thereof.

When epoxy monomer(s) are present in invention compositions, the resulting formulation comprises in the range of about 0.5-20 wt % of said epoxy. In certain embodiments, the resulting formulation comprises in the range of about 2-10 wt % of said epoxy.

When epoxy monomer(s) are present in invention formulations, an epoxy cure agent is also present. Exemplary epoxy cure agents include ureas, aliphatic and aromatic amines, amine hardeners, polyamides, imidazoles, dicyandiamides, hydrazides, urea-amine hybrid curing systems, free radical initiators (e.g., peroxy esters, peroxy carbonates, hydroperoxides, alkylperoxides, arylperoxides, azo compounds, and the like), organic bases, transition metal catalysts, phenols, acid anhydrides, Lewis acids, and Lewis bases.

When present, invention compositions comprise in the range of about 0.1-20 wt % of said epoxy cure agent. In certain embodiments, invention compositions comprise in the range of about 0.5-10 wt % of epoxy cure agent.

Invention compositions typically comprise in the range of about 0.2-2 wt % of said free-radical polymerization initiator. In certain embodiments, invention compositions comprise in the range of about 0.2-1 wt % of said free radical polymerization initiator.

In certain embodiments, invention compositions further comprise a radical stabilizer. When present, radical stabilizers contemplated for use herein include hydroquinones, benzoquinones, hindered phenols, benzotriazole-based ultraviolet absorbers, triazine-based ultraviolet absorbers, benzophenone-based ultraviolet absorbers, benzoate-based ultraviolet absorbers, hindered amine-based ultraviolet absorbers, and the like, as well as combinations of any two or more thereof.

When present, invention compositions comprise in the range of about 0.1-1 wt % of said radical stabilizer. In some embodiments, invention compositions comprise in the range of about 0.1-0.5 wt % of said radical stabilizer.

Particulate fillers contemplated for use in the practice of the present invention include silica, calcium silicate, aluminum hydroxide, magnesium hydroxide, calcium carbonate, magnesium carbonate, magnesium oxide, aluminum nitride, boron nitride, and the like.

Typically, at least 5 wt % of the particulate filler employed in the practice of the present invention has a particle size in the range of about 2-150 nanometers, and the remaining filler has a particle size no greater than 5 microns; and has an average particle size in the range of about 200-1000 nanometers. In some embodiments, at least 10 wt % of the particulate filler employed in the practice of the present invention has a particle size in the range of about 2-150 nanometers; in some embodiments, at least 20 wt % of the particulate filler employed in the practice of the present invention has a particle size in the range of about 2-150 nanometers; in some embodiments, at least 30 wt % of the particulate filler employed in the practice of the present invention has a particle size in the range of about 2-150 nanometers; in some embodiments, at least 40 wt % of the particulate filler employed in the practice of the present invention has a particle size in the range of about 2-150 nanometers; in some embodiments, at least 50 wt % of the particulate filler employed in the practice of the present invention has a particle size in the range of about 2-150 nanometers; in some embodiments, at least 60 wt % of the particulate filler employed in the practice of the present invention has a particle size in the range of about 2-150 nanometers; in some embodiments, at least 70 wt % of the particulate filler employed in the practice of the present invention has a particle size in the range of about 2-150 nanometers; in some embodiments, at least 80 wt % of the particulate filler employed in the practice of the present invention has a particle size in the range of about 2-150 nanometers; in some embodiments, at least 90 wt % of the particulate filler employed in the practice of the present invention has a particle size in the range of about 2-150 nanometers.

Typically, at least 5 wt % of the particulate filler employed in the practice of the present invention has a particle size no greater than 5 microns, and an average particle size in the range of about 200-1000 nanometers. In some embodiments, at least 10 wt % of the particulate filler employed in the practice of the present invention has a particle size no greater than 5 microns, and particle size in the range of about 200-1000 nanometers; in some embodiments, at least 20 wt % of the particulate filler employed in the practice of the present invention has a particle size no greater than 5 microns, and an average particle size in the range of about 200-1000 nanometers; in some embodiments, at least 30 wt % of the particulate filler employed in the practice of the present invention has a particle size no greater than 5 microns, and an average particle size in the range of about 200-1000 nanometers; in some embodiments, at least 40 wt % of the particulate filler employed in the practice of the present invention has a particle size no greater than 5 microns, and an average particle size in the range of about 200-1000 nanometers; in some embodiments, at least 50 wt % of the particulate filler employed in the practice of the present invention has a particle size no greater than 5 microns, and an average particle size in the range of about 200-1000 nanometers; in some embodiments, at least 60 wt % of the particulate filler employed in the practice of the present invention has a particle size no greater than 5 microns, and an average particle size in the range of about 200-1000 nanometers; in some embodiments, at least 70 wt % of the particulate filler employed in the practice of the present invention has a particle size no greater than 5 microns, and an average particle size in the range of about 200-1000 nanometers; in some embodiments, at least 80 wt % of the particulate filler employed in the practice of the present invention has a particle size no greater than 5 microns, and an average particle size in the range of about 200-1000 nanometers; in some embodiments, at least 90 wt % of the particulate filler employed in the practice of the present invention has a particle size no greater than 5 microns, and an average particle size in the range of about 200-1000 nanometers.

Compositions according to the present invention comprise in the range of about 20-80 wt % of said particulate filler. In some embodiments, compositions according to the present invention comprise in the range of about 40-60 wt % of said particulate filler.

Exemplary diluents contemplated for use herein, when present, include aromatic hydrocarbons (e.g., benzene, toluene, xylene, and the like), saturated hydrocarbons (e.g., hexane, cyclohexane, heptane, tetradecane), chlorinated hydrocarbons (e.g., methylene chloride, chloroform, carbon tetrachloride, dichloroethane, trichloroethylene, and the like), ethers (e.g., diethyl ether, tetrahydrofuran, dioxane, glycol ethers, monoalkyl or dialkyl ethers of ethylene glycol, and the like), polyols (e.g., polyethylene glycol, propylene glycol, polypropylene glycol, and the like), esters (e.g., ethyl acetate, butyl acetate, methoxy propyl acetate, and the like); dibasic esters, alpha-terpineol, beta-terpineol, kerosene, dibutylphthalate, butyl carbitol, butyl carbitol acetate, carbitol acetate, ethyl carbitol acetate, hexylene glycol, high boiling alcohols and esters thereof, glycol ethers, ketones (e.g., acetone, methyl ethyl ketone, and the like), amides (e.g., dimethylformamide, dimethylacetamide, and the like), heteroaromatic compounds (e.g., N-methylpyrrolidone, and the like), and the like, as well as mixtures of any two or more thereof.

When diluent is present, invention compositions comprise in the range of about 10-50 wt % diluent, relative to the total composition. In certain embodiments, invention compositions comprise in the range of about 20-40 wt % diluent.

Exemplary compositions according to the present invention comprise:
at least 10 wt % of said radical polymerizable monomer, wherein at least 20 wt % thereof is a maleimide, nadimide or itaconimide monomer and
at least 20 wt % thereof is an acrylate monomer,
at least 5 wt % of said polymer having a polar group,
at least 0.5 wt % of said epoxy,
at least 0.1 wt % of said epoxy cure agent,
at least 0.1 wt % of said initiator,
at least 0.1 wt % of said radical stabilizer,
at least 20 wt % of said filler, and
optionally, up to 50 wt % of a non-reactive organic diluent therefor.

Additional exemplary compositions according to the present invention comprise:
5-40 wt % of said maleimide, nadimide or itaconimide,
5-30 wt % of said acrylate,
5-40 wt % of said polymer having a polar group,
0.5-10 wt % of said epoxy,
0.1-20 wt of said epoxy cure agent,
0.1-2 wt % of said initiator,
0.1-1 wt % of said radical stabilizer,
20-80 wt % of said filler, and
optionally 10-50 wt % of said non-reactive organic diluent therefor.

In certain embodiments, still further exemplary compositions according to the present invention comprise:
10-25 wt % of said maleimide, nadimide or itaconimide,
5-10 wt % of said acrylate,
5-20 wt % of said polymer having a polar group,
02-10 wt % of said epoxy,
5-10 wt % of said epoxy cure agent,
0.2-1 wt % of said initiator,
0.1-0.5 wt % of said radical stabilizer,
40-60 wt % of said filler, and
optionally 20-40 wt % of said non-reactive organic diluent therefor.

In accordance with another embodiment of the present invention, there are provided methods of making the composition described herein, said method comprising combining the components thereof under conditions suitable to produce a substantially homogeneous blend thereof.

In accordance with yet another embodiment of the present invention, there are provided underfill films comprising the reaction product obtained upon B-stage curing a composition as described herein. Underfill films according to the present invention have improved transparency relative to a composition lacking nano-particulate filler therein. For example, underfill films according to the present invention have at least 80% transparency to wavelengths of 550 nm or longer.

In accordance with still another embodiment of the present invention, there are provided methods for preparing underfill films, said method comprising curing a composition as described herein after application thereof to a suitable substrate. Suitable substrates contemplated for use herein include polyethylene terephthalate, polymethyl methacrylate, polyethylene, polypropylene, polycarbonate, an epoxy resin, polyimide, polyamide, polyester, glass, and the like.

In accordance with a further embodiment of the present invention, there are provided articles comprising an underfill film as described herein adhered to a suitable substrate therefor.

In accordance with a still further embodiment of the present invention, there are provided methods for preparing an underfill film, said methods comprising:

applying a composition as described herein to a suitable substrate, and thereafter curing said composition.

In accordance with another embodiment of the present invention, there are provided underfill films prepared as described herein.

In accordance with yet another embodiment of the present invention, there are provided methods of improving the curing speed, transparency, tackiness and/or melt viscosity of a particulate silica-containing underfill formulation, said method comprising replacing at least 5 wt % of said particulate silica with nano-particulate silica having a particle size in the range of about 2-150 nanometers.

Typical cure speeds contemplated by the above-described method, as measured by gel time, fall in the range of about 1-5 seconds at 250° C.

Typical melt viscosities contemplated by the above-described method is less than 20,000 poise, when measured at a ramp rate of 5-10° C./minute.

Typical values for tackiness of said formulation, as measured by a texture analyzer, is less than 100 gram force at room temperature.

Various aspects of the present invention are illustrated by the following non-limiting examples. The examples are for illustrative purposes and do not limit the practice of the present invention. It will be understood that variations and modifications can be made without departing from the spirit and scope of the invention. One of ordinary skill in the art readily knows how to synthesize or commercially obtain the reagents and components described herein.

EXAMPLES

Example 1

Compositions were prepared containing each of the components contemplated above, i.e., at least 10 wt % of a radical polymerizable monomer, wherein at least 20 wt % thereof is a maleimide, nadimide or itaconimide monomer and at least 20 wt % thereof is an acrylate monomer, at least 5 wt % of a polymer having a polar group, at least 0.5 wt % of an epoxy, at least 0.1 wt % of an epoxy cure agent, at least 0.1 wt % of an initiator, at least 0.1 wt % of a radical stabilizer, and 60 vol % of a filler wherein a defined percentage of said filler has a particle size in the range of about 2-150 nanometers (referred to herein as "nano"), and the remaining filler has a particle size no greater than 5 microns, and an average particle size in the range of about 200-1000 nanometers (referred to herein as "non-nano").

Each of the compositions prepared for this example contain the same quantity of filler (i.e., each contain 60 vol % filler), and differ only in the quantity of nano filler (i.e., filler having a particle size in the range of 2-150 nm) relative to the quantity of non-nano filler (i.e., filler having a particle size no greater than 5μ, and an average particle size in the range of 200-1000 nm), as summarized in Table 1 below. DSC values, and the melt viscosity of the resulting compositions were tested. Results are summarized in Table 1.

TABLE 1

| Sample | Filler (vol %) | | DSC | | Melt viscosity | |
| --- | --- | --- | --- | --- | --- | --- |
| | Nano[1] | Non-nano[2] | Onset, ° C. | Peak, ° C. | Eta* (P) | Temp (° C.) |
| 1 | 0 | 60 | 160 | 165 | $1.69 \times 10^4$ | 147 |
| 2 | 10 | 50 | 154 | 166 | 9736.5 | 153.9 |
| 3 | 20 | 40 | 154 | 163 | $1.712 \times 10^4$ | 147.28 |
| 4 | 30 | 30 | 152 | 166 | $1.693 \times 10^4$ | 147.24 |
| 5 | 40 | 20 | 158 | 170 | $2.533 \times 10^4$ | 157.26 |
| 6 | 50 | 10 | 154 | 164 | $3.712 \times 10^4$ | 153.93 |
| 7 | 60 | 0 | 155 | 167 | $3.462 \times 10^4$ | 137.27 |

[1]Nano refers to filler having a particle size in the range of 2-150 nm
[2]Non-nano refers to filler having a particle size no greater than 5μ, and an average particle size in the range of about 200-1000 nm Additional evaluations of the above-described samples were carried out (i.e., B stage TGA at 2 different temperatures, and tack). The results are summarized in Table 2:

TABLE 2

| Sample No. | Filler (vol %) | | B stage TGA (%) | | Tack (gram force) |
| --- | --- | --- | --- | --- | --- |
| | Nano[1] | Non-nano[2] | @ 150° C. | @250° C. | |
| 2 | 10 | 50 | 0.345 | 0.791 | 25.34 |
| 3 | 20 | 40 | 0.421 | 0.929 | 19.79 |
| 4 | 30 | 30 | 0.409 | 0.967 | 4.12 |
| 5 | 40 | 20 | 1.067 | 1.753 | 26.53 |
| 6 | 50 | 10 | 0.6044 | 1.222 | 4.30 |
| 7 | 60 | 0 | 0.5663 | 1.31 | 13.99 |

[1]Nano refers to filler having a particle size in the range of 2-150 nm
[2]Non-nano refers to filler having a particle size no greater than 5μ, and an average particle size in the range of about 200-1000 nm The results set forth in the preceding tables demonstrate that invention compositions have fast cure, low tackiness, good transparency and acceptable melt viscosity.

Example 2

Additional compositions were prepared containing each of the components contemplated above, i.e., at least 10 wt % of a radical polymerizable monomer, wherein at least 20 wt % thereof is a maleimide, nadimide or itaconimide monomer and at least 20 wt % thereof is an acrylate monomer, at least 5 wt % of a polymer having a polar group, at least 0.5 wt % of an epoxy, at least 0.1 wt % of an epoxy cure agent, at least 0.1 wt % of a first, second or third initiator, at least 0.1 wt % of a radical stabilizer, and 50-60 vol % of a filler wherein a defined percentage of said filler has a particle size in the range of about 2-150 nanometers (referred to herein as "nano"), and the remaining filler has a particle size no greater than 5 microns, and an average particle size in the range of about 200-1000 nanometers (referred to herein as "non-nano").

Each of the compositions prepared for this example contain 50-60 vol % filler. In addition to the presence of variable amounts of filler, the compositions illustrated herein may also differ in the quantity of nano filler (i.e., filler having a particle size in the range of 2-150 nm) relative to the quantity of non-nano filler (i.e., filler having a particle size no greater than 5μ, and an average particle size in the range of 200-1000 nm), and the particular initiator employed, as summarized in Table 3 below. DSC values, and the melt viscosity of the resulting compositions were tested. Results are summarized in Table 3.

TABLE 3

| Sample No. | Filler (vol %) | | DSC | | Melt viscosity | |
|---|---|---|---|---|---|---|
| | Nano[1] | Non-nano[2] | Onset, °C. | Peak, °C. | Eta* (P) | Temp (°C.) |
| 8[3] | 20 | 30 | 163.5 | 169 | 4025.4 | 157.26 |
| 9[4] | 20 | 30 | 183.9 | 193.05 | 2838.4 | 170.5 |
| 10[5] | 20 | 30 | 184.5 | 195.3 | 2370.8 | 175.61 |
| 11[3] | 20 | 40 | 163.39 | 167.92 | $1.323 \times 10^4$ | 157.38 |
| 12[4] | 20 | 40 | 184.18/ 257.44 | 194.18/ 277.83 | $1.505 \times 10^4$ | 170.64 |
| 13[5] | 20 | 40 | 215.96 | 265.8 | $1.025 \times 10^4$ | 173.9 |

[1]Nano refers to filler having a particle size in the range of 2-150 nm
[2]Non-nano refers to filler having a particle size no greater than 5μ, and an average particle size in the range of about 200-1000 nm
[3]First initiator
[4]Second initiator
[5]Third initiator Additional evaluations of the above-described samples were carried out (i.e., B stage TGA at 2 different temperatures, and tack). The results are summarized in Table 4:

TABLE 4

| Sample No. | Filler (vol %) | | B stage TGA (%) | | Tack |
|---|---|---|---|---|---|
| | Nano[1] | Non-nano[2] | @ 150° C. | @250° C. | (gram force) |
| 8 | 20 | 30 | 0.632 | 1.343 | <10 |
| 9 | 20 | 30 | 0.933 | 2.345 | <10 |
| 10 | 20 | 30 | 0.435 | 2.174 | <10 |
| 11 | 20 | 40 | 0.518 | 1.300 | <10 |
| 12 | 20 | 40 | 0.494 | 1.870 | <10 |
| 13 | 20 | 40 | 0.405 | 1.632 | <10 |

[1]Nano refers to filler having a particle size in the range of 2-150 nm
[2]Non-nano refers to filler having a particle size no greater than 5μ, and an average particle size in the range of about 200-1000 nm The results set forth in the preceding tables demonstrate that invention compositions have fast cure, low tackiness, good transparency and acceptable melt viscosity.

Various modifications of the present invention, in addition to those shown and described herein, will be apparent to those skilled in the art of the above description. Such modifications are also intended to fall within the scope of the appended claims.

Patents and publications mentioned in the specification are indicative of the levels of those skilled in the art to which the invention pertains. These patents and publications are incorporated herein by reference to the same extent as if each individual application or publication was specifically and individually incorporated herein by reference.

The foregoing description is illustrative of particular embodiments of the invention, but is not meant to be a limitation upon the practice thereof. The following claims, including all equivalents thereof, are intended to define the scope of the invention.

That which is claimed is:

1. A composition comprising:
   10-25 wt. % of at least one radical polymerizable monomer comprising at least 20 wt. % of a (meth)acrylate monomer and at least 20 wt. % of at least one monomer selected from the group consisting of a maleimide monomer, a nadimide monomer, and an itaconimide monomer;
   5-20 wt. % of a polymer having one or more polar groups selected from the group consisting of a hydroxyl group, a carboxyl group, and a (meth)acryloyl group;
   optionally, an epoxy monomer;
   optionally, an epoxy cure agent;
   0.1-0.5 wt. % of a free-radical polymerization initiator;
   40-60 wt. % of a particulate filler, wherein at least 5 wt. % of said filler has a particle size in the range of about 2-150 nanometers, and the remaining filler has a particle size no greater than 5 microns;
   optionally a radical stabilizer; and
   optionally a non-reactive organic diluent therefore,
   wherein the melt viscosity of said composition is less than 20,000 poise, when measured at a ramp rate of 5-10° C./minute.

2. The composition of claim 1 wherein said (meth)acrylate monomer comprises an acrylate.

3. The composition of claim 2 wherein the (meth)acrylate monomer is selected from the group consisting of monofunctional (meth)acrylates, difunctional (meth)acrylates, trifunctional (meth)acrylates, and higher functional (meth)acrylates.

4. The composition of claim 1 wherein the polymer having one or more polar groups is selected from the group consisting of phenoxy resins, polyester resins, polyurethane resins, polyimide resins, siloxane-modified polyimide resins, polybutadiene, polypropylene, styrene-butadiene-styrene copolymer, styrene-ethylene-butylene-styrene copolymer, polyacetal resins, polyvinylbutyral resin, polyvinylacetal resin, polyamide resins, acrylonitrile-butadiene copolymer, acrylonitrile-butadiene-acrylic acid copolymer, acrylonitrile-butadiene-styrene copolymer, polyvinyl acetate, nylon, (meth)acrylic resins, (meth)acrylic rubbers, urethane (meth)acrylate polymers, acrylic copolymers and modified polymers thereof.

5. The composition of claim 1 wherein the epoxy is present and is a liquid-type epoxy based on bisphenol A, a solid-type epoxy based on bisphenol A, a liquid-type epoxy based on bisphenol F, a multifunctional epoxy based on phenol-novolac resin, a dicyclopentadiene-type epoxy, a naphthalene-type epoxy, or a mixture of any two or more thereof.

6. The composition of claim 5 wherein the composition comprises in the range of about 0.5-20 wt. % of said epoxy.

7. The composition of claim 1 wherein the epoxy is present and is: a diepoxide of a cycloaliphatic alcohol, hydrogenated bisphenol A, a difunctional cycloaliphatic glycidyl ester of hexahydrophthalic anhydride, or a mixture of any two or more thereof.

8. The composition of claim 1 wherein, when said epoxy is present, the epoxy cure agent is also present and is selected from the group consisting of ureas, aliphatic and aromatic amines, amine hardeners, polyamides, imidazoles, dicyandiamides, hydrazides, urea-amine hybrid curing systems, free radical initiators, organic bases, transition metal catalysts, phenols, acid anhydrides, Lewis acids, and Lewis bases.

9. The composition of claim 8 wherein said composition comprises in the range of about 0.1-20 wt. % of said epoxy cure agent.

10. The composition of claim 1 wherein the free-radical polymerization initiator is a peroxy ester, a peroxy carbonate, a hydroperoxide, an alkylperoxide, an arylperoxide, or an azo compound.

11. The composition of claim 1 wherein the radical stabilizer, when present, is selected from the group consisting of hydroquinones, benzoquinones, hindered phenols, benzotriazole-based ultraviolet absorbers, triazine-based ultraviolet absorbers, benzophenone-based ultraviolet absorbers, benzoate-based ultraviolet absorbers, and hindered amine-based ultraviolet absorbers.

12. The composition of claim 11 wherein said composition comprises in the range of about 0.1-1 wt. % of said radical stabilizer.

13. The composition of claim 1 wherein said filler is silica.

14. The composition of claim 1 wherein at least 10 wt. % of said particulate filler has a particle size in the range of about 2-150 nanometers, and the remaining filler has a particle size no greater than 5 microns; and in total said particulate filler has an average particle size in the range of about 200-1000 nanometers.

15. The composition of claim 1 wherein said diluent, when present, is an aromatic hydrocarbon, a saturated hydrocarbon, a chlorinated hydrocarbon, an ether, a polyol, an ester, a ketone, an amide, or a heteroaromatic compound.

16. The composition of claim 15 wherein said diluent, when present, comprises in the range of about 10-50 wt. % of the total composition.

* * * * *